(12) United States Patent
Stiyer et al.

(10) Patent No.: US 9,263,303 B2
(45) Date of Patent: Feb. 16, 2016

(54) METHODOLOGIES FOR RINSING TOOL SURFACES IN TOOLS USED TO PROCESS MICROELECTRONIC WORKPIECES

(75) Inventors: Mark A. Stiyer, Minneapolis, MN (US); David Dekraker, Burnsville, MN (US)

(73) Assignee: TEL FSI, INC., Chaska, MN (US)

( * ) Notice: Subject to any disclaimer, the term of this patent is extended or adjusted under 35 U.S.C. 154(b) by 919 days.

(21) Appl. No.: 13/157,695

(22) Filed: Jun. 10, 2011

(65) Prior Publication Data
US 2011/0303246 A1    Dec. 15, 2011

(51) Int. Cl.
*B08B 3/04* (2006.01)
*H01L 21/67* (2006.01)

(52) U.S. Cl.
CPC ............ *H01L 21/67051* (2013.01); *B08B 3/04* (2013.01)

(58) Field of Classification Search
CPC ................... H01L 21/67051; H01L 21/67023
USPC ........................ 134/182, 198, 199, 200, 902
See application file for complete search history.

(56) References Cited

U.S. PATENT DOCUMENTS

| 6,375,757 B2 | 4/2002 | Gazewood |
| 2009/0038647 A1 | 2/2009 | Dekraker et al. |
| 2009/0280235 A1 | 11/2009 | Lauerhaas et al. |

FOREIGN PATENT DOCUMENTS

| JP | 2005-44872 A | 2/2005 |
| WO | 2009137032 A2 | 11/2009 |

*Primary Examiner* — Michael Kornakov
*Assistant Examiner* — Natasha Campbell
(74) *Attorney, Agent, or Firm* — Kagan Binder, PLLC

(57) ABSTRACT

Rinsing methodologies and components to accomplish rinsing of tool surfaces in tools that are used to process one or more microelectronic workpieces. The invention can be used to rinse structures that overlie a workpiece being treated in such a manner to function in part as a lid over the process chamber while also defining a tapering flow channel over the workpiece. Rather than spray rinsing liquid onto the surface in a manner that generates undue splashing, droplet, or mist generation, a swirling flow of rinse liquid is generated on a surface of at least one fluid passage upstream from the surface to be rinsed. The swirling flow then provides smooth, uniform wetting and sheeting action to accomplish rinsing with a significantly reduced risk of generating particle contamination.

9 Claims, 8 Drawing Sheets

METHODOLOGIES FOR RINSING TOOL SURFACES IN TOOLS USED TO PROCESS MICROELECTRONIC WORKPIECES

CROSS-REFERENCE TO RELATED APPLICATION

This application claims the benefit of U.S. Provisional Patent Application Ser. No. 61/353,931 filed Jun. 11, 2010, entitled METHODOLOGIES FOR RINSING TOOL SURFACES IN TOOLS USED TO PROCESS MICROELECTRONIC WORKPIECES, the entire disclosure of which is incorporated herein by reference.

FIELD OF THE INVENTION

The present invention relates to improved methods and apparatuses to rinse tool surfaces in tools used to process microelectronic workpieces. More particularly, the present invention relates to generating and using swirling flows of rinse liquids to clean tool surfaces such as the underside surface of lids used to cover process chambers in which one or more microelectronic workpieces are being processed.

BACKGROUND OF THE INVENTION

The microelectronic industry relies on a variety of different processes to manufacture microelectronic devices. Many processes involve a sequence of treatments in which different kinds of treatment fluids are caused to contact the workpiece in accordance with desired recipes. These fluids may be liquids, gases, or combinations thereof. In some treatments, solids may be suspended or dissolved in a liquid or entrained in a gas.

Innovative tools for processing microelectronic workpieces are described in Assignee's issued U.S. Pat. No. 7,681, 581 (hereinafter Assignee's Patent No. 1) as well as in Assignee's co-pending U.S. patent applications now published as U.S. Patent Publication Nos. US-2007-0245954-A1 (hereinafter referred to as the Co-Pending Application No. 1); 2008-0271763-A1 (bearing Application No. 2); US-2008-0008834-A1 (hereinafter referred to as Co-Pending Application No. 3); 2009-0038647-A1 (hereinafter referred to as Co-Pending Application No. 4); and 2009-0280235-A1 (hereinafter referred to as Co-Pending Application No. 5). The entireties of the '581 patent and of these co-pending U.S. patent applications are incorporated herein by reference for all purposes.

The embodiments of the processing sections of these tools as described in the '581 patent cited above and in the co-pending U.S. patent applications cited above advantageously include nested duct features that allow one or more duct pathways to be selectively opened and closed. For example, when the structures are moved apart relatively, a duct pathway opens and is enlarged between the structures. When the structures are moved together relatively, the duct between the structures is choked and is reduced in size. In preferred embodiments, multiple ducts can exist in the same volume of space depending upon how the moveable duct structures are positioned. Thus, multiple ducts can occupy a volume minimally larger than the volume occupied by only a single duct. The ducts are used to capture various treatment fluids, including liquid and/or gases, for recycling, discarding, or other handling. Different treatment fluids can be recovered in different, independent ducts to minimize cross-contamination and/or to use unique capture protocols for different fluids. Because of the nested character of the duct structures, the duct system also is extremely compact.

The '581 patent cited above and the co-pending U.S. patent applications cited above also describe an innovative spray nozzle/barrier structure. This structure includes capabilities for dispensing treatment materials in multiple ways such as by a spray, a center dispense, and gas or vapor introduction. The barrier structure overlies the underlying workpiece. The lower surface of the barrier structure is shaped in preferred embodiments so that it defines a tapering flow channel over the workpiece. This approach offers many benefits. The tapering flow channel helps to promote radial flow outward from the center of the workpiece while minimizing recirculation zones. The taper also helps to smoothly converge and increase the velocity of flowing fluids approaching the outer edge of the workpiece. This helps to reduce liquid splash effects. The angle of the lower surface also helps liquid on the lower surface to drain toward the outer periphery. The tapering configuration also helps to reduce recirculation of particles back onto the workpiece. The configuration also helps facilitate chemical reclaim efficiency by better containment of fluids.

Notwithstanding all these benefits, further improvements are still desired. Firstly, during the course of treating a workpiece, the lower surface of the barrier structure may bear drops or films of liquid(s) used during the treatment and/or as a result of rinsing the barrier structure. For example, Assignee's Co-Pending Application No. 3 describes a rinsing strategy in which rinse tubes are led downward through a chimney leading into a process chamber, wherein the chimney provides a path of egress into the process chamber generally through a central region of the barrier structure. The rinse tubes extend into the process chamber so that their lower ends are generally at the same height as the lower surface of the barrier structure. A rinsing liquid is sprayed onto the lower surface through nozzles attached to the ends of the tubes. Assignee's Co-Pending Application No. 4 describes using a rinse manifold to generate a flow of rinse liquid on surfaces upstream from the process chamber. The rinse liquid is conveyed smoothly along these surfaces and then wets the underside of the barrier structure.

While these strategies effectively rinse the barrier structure, the resultant rinsing action may have more tendencies than desired to splash or drip when impacting the barrier structure. This can generate droplets or mists that, in turn, can lead to particle contamination on the underlying workpiece. Also, the alignment and dispense pattern of the rinses in either strategy can be more difficult to set up. The tubes and nozzles can collect moisture, which can drip and cause contamination. The tubes and nozzles can also obstruct and/or disrupt the flow of liquids and gases into the process chamber. Improved rinsing methodologies are therefore desired.

SUMMARY OF THE INVENTION

The present invention provides improved rinsing methodologies and components to accomplish rinsing of tool surfaces in tools that are used to process one or more microelectronic workpieces. The invention is particularly advantageous when used to rinse the lower surface of lids and other structures such as a moveable barrier plate that overlies a workpiece being treated in such a manner to function in part as a lid over the process chamber while also defining a tapering flow channel over the workpiece. Rather than spray rinsing liquid onto the surface in a manner that generates undue splashing, droplet, or mist generation, a swirling flow of rinse liquid is generated on a surface of at least one fluid passage upstream from the surface to be rinsed. The swirling flow then provides smooth, uniform wetting and sheeting action to accomplish rinsing with a significantly reduced risk of generating particle contamination.

Advantageously, illustrative embodiments incorporate very few components, easing assembly and improving reliability. The components are much less sensitive to alignment variations that might arise during manufacture, shipment, or use. This further eases manufacture and use while allowing the present invention to retain a high level of rinsing performance over a wide tolerance range. The swirling flow pattern provides improved coverage and wetting uniformity of surfaces being rinsed. Substantially complete and uniform wetting of surface structures can be achieved very easily. The swirling action can wet the underside of a lid or other structure with much less tendency for the rinse to fall onto an underlying workpiece.

In one aspect of the present invention a method of rinsing an apparatus is provided. The method comprises the steps of: a) providing an apparatus comprising a process chamber in which at least one microelectronic workpiece is positioned during a treatment and a structure including a lower surface that overlies and at least partially covers the at least one workpiece; b) aiming a rinsing fluid obliquely toward a generally annular gap or portion thereof under conditions effective to generate a swirling flow of the rinsing fluid; and c) causing the swirling flow of rinsing liquid to wet the lower surface of the structure.

In another aspect of the present invention an apparatus for processing at least one microelectronic workpiece is provided. The apparatus comprises: a) a process chamber in which the at least one microelectronic workpiece can be positioned during processing; b) a structure including a lower surface and a generally annular gap, wherein the lower surface overlies and at least partially covers the at least one workpiece during processing; d) at least one nozzle in fluid communication with and obliquely directed toward the annular gap and configured so a swirling flow of a fluid is generated when the fluid is ejected through the nozzle and into the annular gap; and (e) at least one wall that fluidly directs the swirling flow of fluid to the lower surface of the structure.

In yet another aspect of the present invention an apparatus for processing at least one microelectronic workpiece is provided. The apparatus comprises: a) a process chamber in which the at least one microelectronic workpiece can be positioned during processing; b) a structure including a lower surface that overlies and at least partially covers the at least one workpiece during processing; c) at least one diverging pathway providing an egress into the process chamber, the diverging pathway including a pathway surface that is fluidly coupled to the lower surface of the structure; and d) at least one nozzle obliquely directed toward a generally annular gap and configured so a swirling flow of a fluid is generated in the annular gap when the fluid is ejected through the nozzle and into the annular gap, wherein the annular gap is upstream from and fluidly coupled to the pathway surface so the swirling flow of fluid generated in the annular gap is conveyed to the lower surface of the structure via one or more surfaces comprising at least the pathway surface of the diverging pathway.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein.

DETAILED DESCRIPTION OF PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

Figure 1:
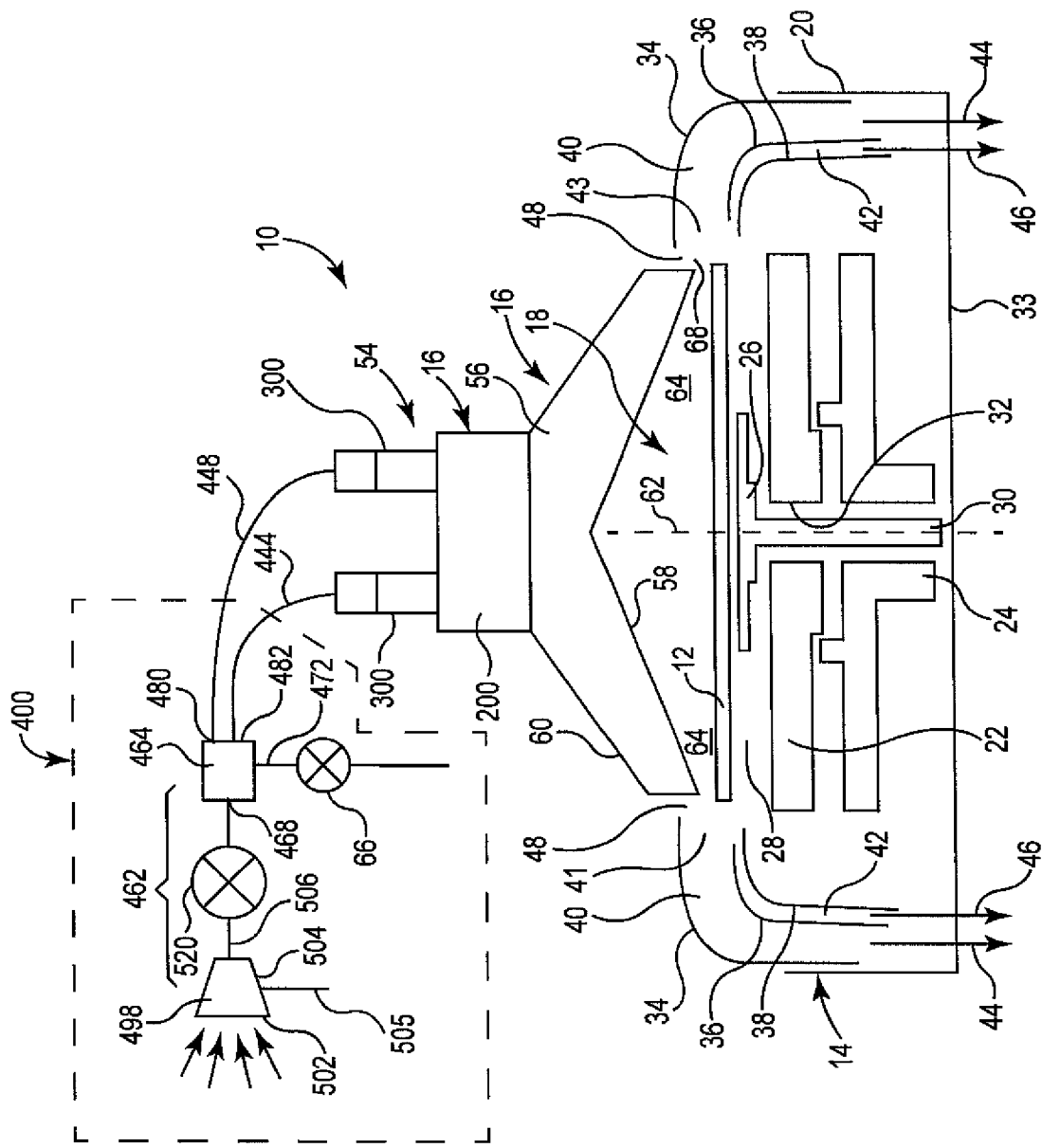
FIG. 1 is a schematic view of a single wafer processing tool incorporating principles of the present invention.

The principles of the present invention may be used in connection with tools that process workpieces singly or in batches. For purposes of illustration, FIG. 1 schematically shows an illustrative tool 10 that incorporates principles of the present invention and that is of the type in which a single workpiece 12 is housed in the tool 10 at any one time and subjected to one or more treatments in which liquid(s), gas (es), and/or other processing media are caused to contact the workpiece 12. In the microelectronics industry, for instance, tool 10 may be referred to as a single wafer processing tool. Workpiece 12 typically comprises a semiconductor wafer or other in-process microelectronic substrate. Although the principles of the present invention are described in the context of tool 10, the principles of the invention can be used to incorporate rinsing functionality into a wide range of other microelectronic processing systems as well.

As schematically shown in FIG. 1, tool 10 generally includes as main assemblies a base section 14 and a barrier/dispense section 16. In actual use, the base section 14 and the barrier/dispense section 16 would be mounted to a framework (not shown) and enclosed within a housing (not shown) of tool 10. This mounting can occur in any manner such as via screws, bolts, rivets, adhesives, welds, clamps, brackets, combinations of these, or the like. Desirably, though, the sections 14 and 16 and/or components thereof are independently and removably mounted to facilitate service, maintenance, upgrade, and/or replacement.

Base section 14 and barrier/dispense section 16 help define processing chamber 18 in which workpiece 12 is positioned during processing. Base section 14 and/or barrier/dispense section 16 include one or more features or capabilities to allow workpiece 12 to be loaded into and taken from processing chamber 18. Such features and capabilities may include, for instance, a door (not shown) that may be opened or closed to provide the desired egress. Alternatively, and as contemplated in preferred modes of practice, one or both of base section 14 and barrier/dispense section 16 are moveable relative to each other to provide this egress. Conveniently, this relative movement may occur in an illustrative embodiment, for instance, by raising and lowering barrier dispense section 16 while keeping at least a portion of base section 14 fixed to the surrounding framework (not shown). In embodiments in which the base section 14 includes one or more moveable baffle members such as described in Assignee's Co-Pending Applications Nos. 1 and 2, the baffle member(s) can be raised and lowered to facilitate such egress.

Base section 14 generally includes a housing 20, chuck 22, backside dispense head 26, and annular baffle members 34, 36, and 38. A motor (not shown) is used to rotatably drive the chuck. Inside processing chamber 18, workpiece 12 is supported and held by chuck 22. Chuck 22 may be stationary or it may be rotatable about a central axis. For purposes of illustration, the figures illustrate an embodiment of tool 10 in which chuck 22 is rotatably driven by motor (not shown) so that workpiece 12 may be spun about an axis during processing. In those embodiments in which workpiece 12 is spun by a rotating chuck 22, the spinning helps to spread dispensed treatment materials uniformly over the workpiece 12.

Chuck 22 may secure workpiece 12 in any of a variety of different ways in accordance with conventional practices now or hereafter developed. Preferably, chuck 22 includes edge gripping structures (not shown) that securely hold workpiece 12 such that there is a gap 28 between workpiece 12 and the chuck 22. This kind of positioning allows treatment chemicals, including rinse water, to be dispensed onto either the upper face or lower face of workpiece 12.

Optionally, tool 10 may include dispense structure(s) for treating the lower face of workpiece 12. An illustrative backside dispense mechanism is shown as a generally circular backside dispense head 26 through which one or more treatment chemicals may be dispensed toward lower face of workpiece 12. Treatment chemicals are supplied to backside dispense head 26 via shaft 30 that passes through central bore 32 of chuck 22. In embodiments in which chuck 22 rotates, there are gaps between shaft 30, and central bore 32 so that the parts do not contact as the chuck 22 rotates. The backside dispense head 26 may be coupled to one or more supplies (not shown) of treatment materials to be dispensed as supplied or blended on demand.

The housing 20 helping to enclose the process chamber 18 generally includes base pan 33 and movable, annular baffle members 34, 36, and 38. The baffle members 34, 36, and 38 provide movable boundaries defining at least a portion of exhaust ducts 42 and 44. The ducts 42 and 44 are used to capture various treatment fluids for recycling, discarding, or other handling. Different treatment fluids can be recovered in different, independent ducts to minimize cross-contamination and/or to use unique capture protocols for different fluids. Each of the ducts 42 and 44 has a respective inlet 41 and 43 proximal to the outer periphery of the workpiece 12. Each of the ducts 42 and 44 has a respective outlet 44 and 46 through which material(s) are discharged.

Adjacent baffle members are movable toward or away from each other in order to choke or open a corresponding duct pathway. For example, when adjacent baffle members are moved apart relatively, a duct pathway opens between them and is enlarged between the structures. When the structures are moved together relatively, the duct between the structures is choked and is reduced in size. For purposes of illustration, the exhaust duct 40 between the top baffle member 34 and the middle baffle member 36 is open, while the lower exhaust duct 42 between the middle baffle member 36 and the bottom baffle member 38 is choked.

For purposes of illustration, tool 10 includes three movable and nestable baffle members 34, 36, and 38 with two exhaust ducts 42 and 44 formable between these members. However, other embodiments of the invention may include a greater or lesser number of baffle members than this, and thus a correspondingly greater or lesser number of exhaust ducts.

There may be a gap 48 between the base section 14 and the barrier/dispense section 16. When the tool 10 is operated in a closed mode of operation, such as a treatment of workpiece 12 in which oxygen from the ambient or other sources is to be excluded from the process chamber 18, it is desirable to block and/or eliminate this gap 48 so that oxygen cannot gain egress into the process chamber 18 through this gap 48. This can be done in a variety of ways. As some options, the gap 48 may be sealed by using gaskets, other suitable sealing components, and/or even by using a curtain of flowing gas to form a boundary across the gap 48 to isolate the chamber 18 from the ambient external to the chamber 18. This boundary in the form of a gas curtain can be established on demand at any time such as during at least a portion of any treatment in which it is desired to isolate the chamber 18 from the ambient for any reason. A pressurized gas supplied from a suitable source (not shown) via suitable plumbing (not shown), such as nitrogen, carbon dioxide, argon, combinations of these, and the like may be used to form a desired gas curtain.

In particularly preferred embodiments, the base section 202 is in the form of the "processing section 11" described and illustrated in Assignee's Co-Pending Applications Nos. 1 and 2. In such embodiments, an annular curtain of gas is provided between the inner rim of the baffle member and the outer periphery of the adjacent barrier plate structure. A representative embodiment of the invention having this structure is described in more detail in Assignee's copending Application No. 5.

Still referring to FIG. 1, an illustrative embodiment of barrier/dispense section 16 generally includes a barrier plate 56, collar 200, intake manifolds 300, gas distribution system 400, dispense features described further below, and plumbing (not shown). The barrier/dispense section 16 is similar to the "dispense assembly 554" of Assignee's Co-Pending Applications Nos. 1 through 5 and therefore may be coupled to the "moveable member 526" and substituted for the barrier/dispense sections described, shown, and/or referred to in these co-pending Applications.

According to a preferred embodiment, barrier plate 56 is generally annularly shaped, having a lower surface 58. Advantageously, lower surface 58 of barrier plate 56 includes one or more features that help to collect and remove liquid that may be present. As one strategy, aspiration features and techniques may be used for liquid removal as described in Assignee's Co-Pending Application No. 3. To this end, tubing (not shown) is provided for aspirating liquid from the lower surface 58 of the barrier plate 56. Via z-axis movement, such as by using a component such as "moveable support member 526" according to Assignee's Co-pending Applications Nos. 1 and 2, the position of barrier plate 56 relative to the underlying workpiece 12 can be controlled.

Preferably, at least lower surface 58 of barrier plate 56 is angled downward in a radially outward direction from the central axis 62 relative to the underlying plane of workpiece 12 to establish a tapering flow channel 64 between workpiece 12 and lower surface 58 of barrier plate 56. The tapering configuration of channel 64 helps to promote radial flow outward from the center of workpiece 12 while minimizing recirculation zones. The taper also helps to smoothly converge and increase the velocity of flowing fluids approaching the outer edge of workpiece 12. This helps to reduce liquid splash effects. The angle of lower surface 58 also helps motivate liquid on lower surface 58 to flow to the outer periphery, where the collected liquid can be aspirated away rather than drip downward onto workpiece 12. The configuration also helps facilitate chemical reclaim efficiency by better containment of fluids. The angled lower surface 58 can have a variety of geometries. For instance, the geometry can be one or more of linear (conical), parabolic, polynomial, or the like. For purposes of illustration, the lower surface 58 generally linearly converges toward workpiece 12 in a radially outward direction.

Additionally with respect to this particular embodiment, the generally annular barrier plate 56 functions in one respect as a lid or cover over processing chamber 18 in order to help provide a protected environment for workpiece treatment and to help contain dispensed materials in the processing chamber 18. However, because the barrier plate 56 is movable up and down in many embodiments, the generally annular barrier plate 56 preferably comes into close proximity, rather than direct physical contact with, other barriers helping to define processing chamber 18, such as to establish the gap 48. This minimizes particle generation that might otherwise occur as a result of such contact. This also minimizes the risk that a controller will lose track of stepper motor steps that might occur in the course of movement of the barrier plate 56. Preferred embodiments of barrier plate 56 are further described in Assignee's Co-Pending Application Nos. 3 and 5.

A spray bar (not shown) can also be fitted to the underside of the barrier plate to provide dispense functionality to spray one or more treatment chemicals onto the workpiece 12. Such a spray bar may have a footprint that spans all or a portion of the underlying workpiece. Spray bar embodiments are described in Assignee's Co-Pending Applications and issued patent cited herein.

Figure 2:
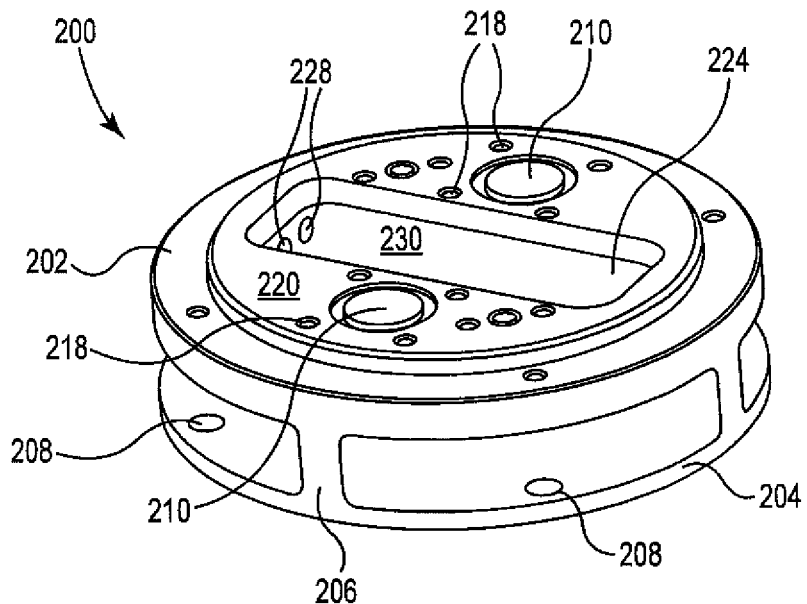
FIG. 2 is a top perspective view of the collar used in the tool of FIG. 1.
Figure 3:
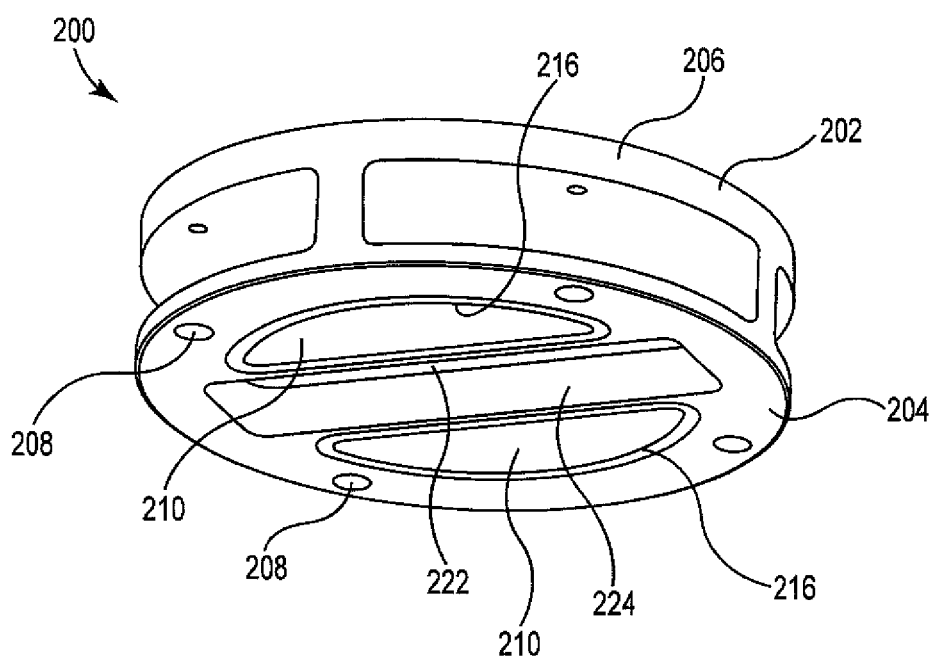
FIG. 3 is a bottom perspective view of the collar used in the tool of FIG. 1.

A collar 200 is fitted onto the top of the barrier plate 56. The collar 200 includes features for connecting plumbing, dispensing components, and other features while at the same time helping to isolate process chamber 18 from the ambient. Collar 200 can also provide functionality including helping to distribute rinse fluid(s), contain fumes, and providing a venturi function. As seen best in FIGS. 2 through 4, collar 200 includes a top flange 202, a base flange 204, and a body 206. Base flange 204 is mounted to the underlying barrier plate 56 using any suitable fastening technique. For purposes of illustration, base flange 204 includes through apertures 208 for securing collar 200 to barrier plate 56 using suitable threaded fasteners (not shown). Alternative fastening techniques useful in this or any other fastening context of the present invention include rivets, glue, bolts, welds, clamps, tape, combinations of these, and the like.

Passageways 210 extend through collar 200 from inlets 214 to outlets 216. Each passageway 210 is defined at least in part by walls 212. As illustrated in this embodiment, each wall 212 smoothly diverges in a direction from relatively smaller inlet 214 that is generally round in cross-section to the relatively larger outlet 216 that is generally D-shaped in cross-section. The diverging geometry of each passageway 210 provides numerous benefits, including providing a relatively higher flow velocity at inlet 214 for containment, a relatively lower flow velocity at outlet 216 for smoother flow into process chamber 18, and distribution of fluids such as rinsing fluids to the underside surface 58 of barrier plate 56. Each outlet 216 is generally D-shaped to match the geometry of a corresponding aperture in the underlying barrier plate 56 in some embodiments. In use, each passageway 210 can be used to introduce process gases and/or vapors into the processing chamber 18 from one or more suitable sources that are fluidly coupled to the passageways. Accordingly, each passageway 210 desirably is smoothly contoured to promote smooth flow of these gases and/or vapors through collar 200 and then into the process chamber 18.

In addition to a diverging geometry as shown, other geometries may also be used for passageways 210. For instance, a portion of a passageway in alternative embodiments may include a portion that converges and then diverges such that the passageway includes a venturi feature such as is described in one or more of Assignee's patent properties cited herein. A venturi feature can help promote containment of processing gases and other fluids in the underlying process chamber 18.

Threaded apertures 218 provide an easy way to attach plumbing and other components, such as intake manifolds 300, to the top surface 220 of collar 200 using suitable fasteners. Optionally, suitable features such as grooves and corresponding fitted gaskets or the like can be provided in top surface 220 to help ensure a fluid tight seal between plumbing components and collar 200. Similarly, features such as grooves and gaskets can be provided around the D-shaped outlets 216 to help provide a fluid tight seal between collar 200 and the underlying barrier plate 56.

In the central region of collar 200, pocket 224 provides a convenient pathway through which plumbing, nozzles, electrical lines, fiber optics, sensors, and other tool components may be led. A floor 222 is recessed within pocket 224 and includes apertures 226 which can be used to mount and/or lead such components. For example, a central dispense nozzle (see co-pending applications cited herein) can be mounted to a suitably located aperture in floor 222 in order to provide a pathway by which treatment fluids can be dispensed centrally onto an underlying workpiece 12. Plumbing line(s) (not shown) that supply the spray bar (if any) also may be secured to and/or led through floor 222. Rinsing lines also may be led into process chamber 18 through one or more of these apertures. Apertures 228 on pocket walls 230 can also be used to lead plumbing, electronic, or other lines into pocket 224 and then to the process chamber 18.

As described further below, a swirling flow of rinsing fluid generated by rinsing techniques of the present invention may be used to rinse the underside of the barrier plate 56. In many instances, the rinsing fluid will be water or another aqueous composition. This swirling flow will be guided to the underside of the barrier plate 56 at least in part by the walls 212 defining passageways 210. To facilitate smooth conveyance of this swirling, aqueous flow to the barrier plate 56, it is desirable to fabricate collar 200 from hydrophilic material(s). Quartz is an example of a suitable hydrophilic material. Another example of a suitable hydrophilic material comprises polyvinylidene fluoride (PVDF) having an appropriate surface treatment. Such surface treatments can include roughening, abrading, bead-blasting, chemically eroding, etching, and the like, for example. Another example of a suitable hydrophilic material can be obtained by irradiating polyphenylene sulfide (PPS), generally a hydrophobic material, with a suitable dosage of ionizing radiation such as ultraviolet radiation, electron beam radiation, or the like. The PPS often has a light yellow color as supplied. A suitable dosage of radiation modifies the color of the PPS to be yellowish-brown without unduly compromising the physical properties of the PPS. Often, the color change is a visual indicator that the surface has been rendered hydrophilic. A simple empirical test can be done by pouring water onto the treated material to see if the water beads up or sheets out. In some instances, a color change may be observed and yet the surface remains hydrophobic. The material can be retreated with the ionizing energy one or more times until the surface becomes hydrophilic. Combinations of two or more hydrophilic materials also may be used.

Referring mainly to FIGS. 1 and 4-11, intake manifolds 300 are connected to collar 200. Each intake manifold 300 constitutes a portion of a pathway, along with the corresponding passageway 210, through which one or more gases, vapors, or the like are supplied to processing chamber 18. At least one of the intake manifolds, but preferably both, also incorporate rinse features that help to generate a swirling flow of water or other suitable liquid to be used to rinse surfaces 212 and the underside 58 of the barrier plate 56.

As main components, each intake manifold 300 includes a base 302 and a cover 304 fitted onto the base 302. Each base 302 in this illustrative embodiment includes a lower body portion 306 with a cylindrical cross-section, an upper body portion 308 with a square cross-section, and a mounting flange 310. Mounting holes 312 in flange 310 can be used to help fasten intake manifold 300 to collar 200. Passageway 314 extends through base 302 from inlet end 316 and outlet 318. Proximal to inlet end 316, passageway 314 is configured with a counterbore 320 including sidewall 324 and face 326. Cylindrical wall 328 defines the remainder of passageway 314 extending from counterbore 320 to outlet 318.

Figure 12:
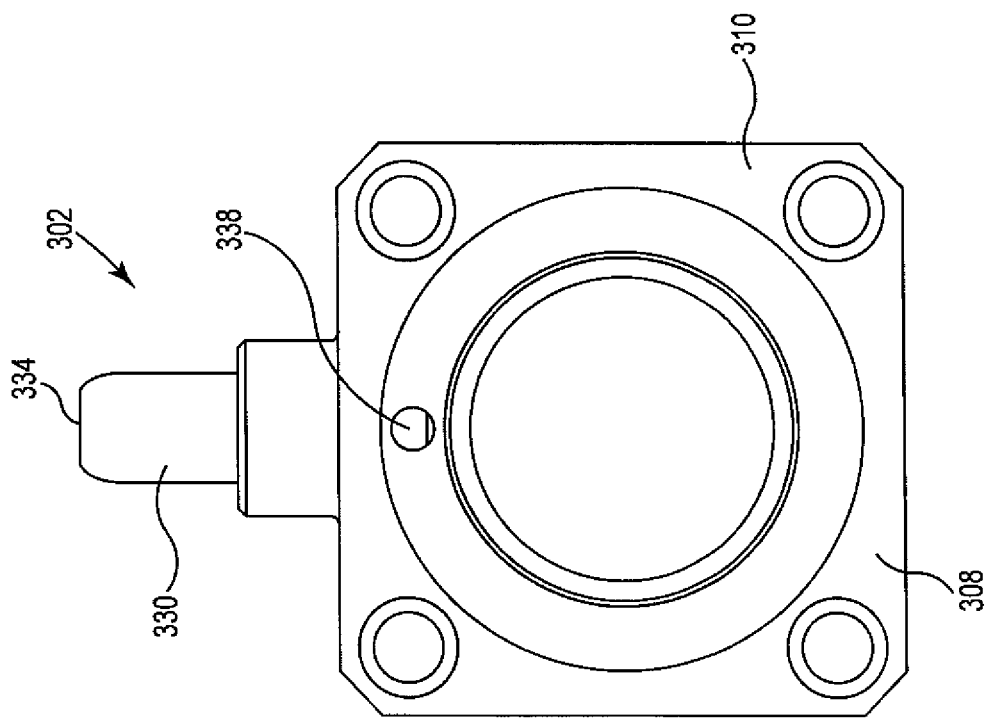
FIG. 12 is a bottom view of the base shown in FIG. 10.

Base 302 desirably includes at least a portion of the features used to generate a swirling flow of rinsing liquid to wet and rinse the underside surface 58 of the barrier plate 56 as well as surfaces 212 of collar 200. A plumbing connection 330 is provided on at least one side of upper body portion 308 to provide a site to attach a supply line (not shown) through which rinsing liquid is supplied from one or more suitable sources (not shown). A supply conduit 332 extends from inlet 334 at the tip 336 of the connection 330 to outlet 338 provided at face 326 (see FIGS. 7 and 12).

For each manifold 300 in the illustrated embodiment, a cover 304 extends from top end 350 to bottom end 352 and includes as main components body 344, mounting flange 346, and stepped boss 348. Apertures 347 in flange 346 facilitate mounting cover 304 to the corresponding base 302. Passageway 356 extends through cover 304 from an inlet 358 proximal to top end 350 and an outlet 360 proximal to bottom end 352. The passageways 356 serve as respective portions of the pathways along which gases, vapors, and the like are fed to process chamber 18. Each manifold 300 is connected to collar 200 so that the passageway 356 is upstream from the corresponding passage 210 in collar 200. Proximal to outlet 360, each passageway 356 optionally may have a convex contour (not shown) to facilitate smooth delivery of fluids from passageway 356 into the corresponding passageway 210. The portion of passageway 356 between inlet 358 and outlet 360 is defined by cylindrical wall 364. O-ring(s) (not shown) in groove 366 proximal to top end 350 provide one illustrative way to couple cover 304 to supply lines 444 and 448.

Figure 7:
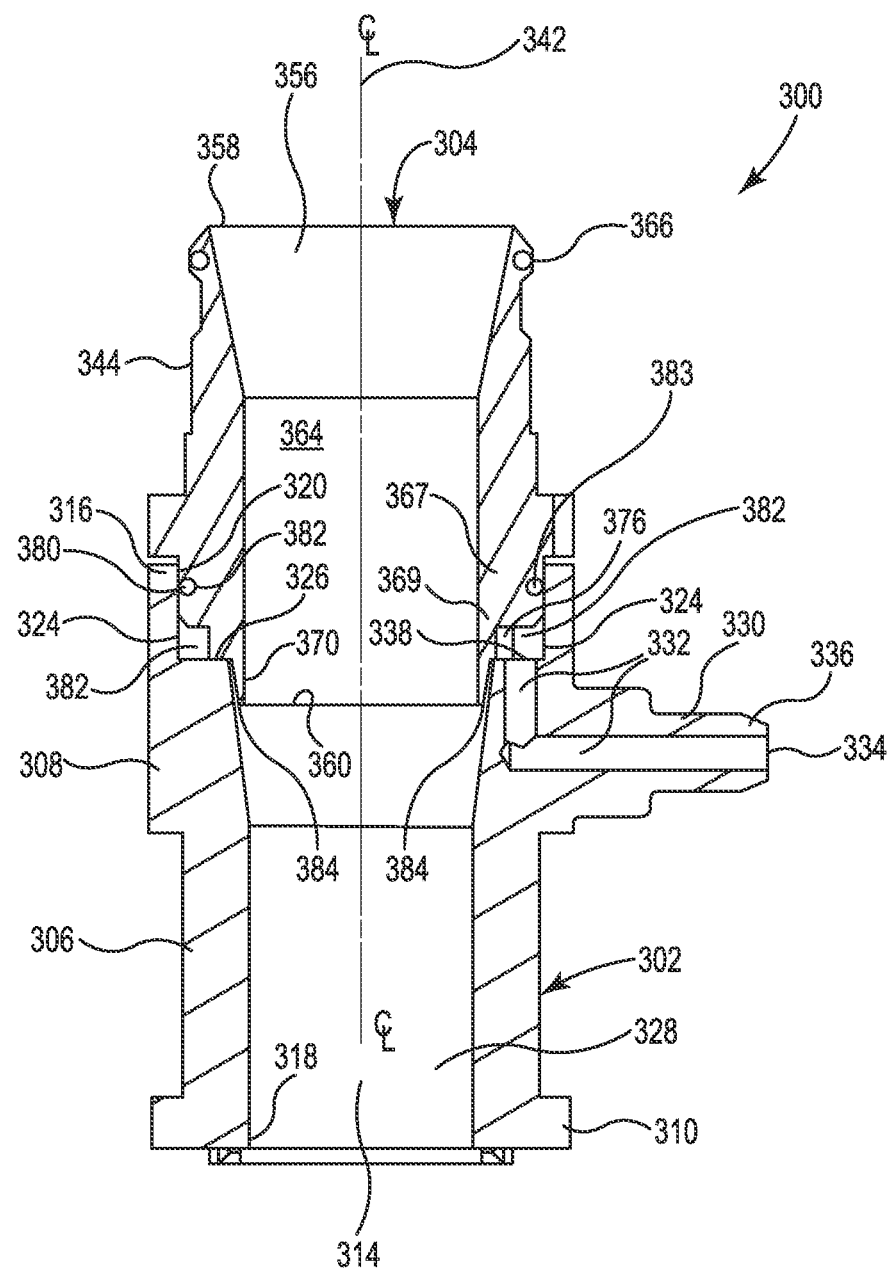
FIG. 7 is a side cross-section view of the intake manifold assembly used in the tool of FIG. 1.
Figure 8:
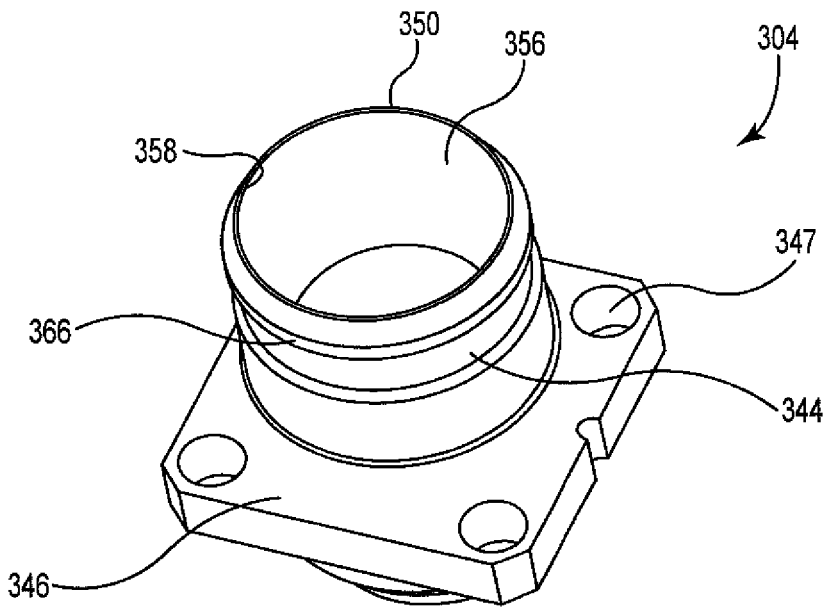
FIG. 8 is a top perspective view of the cover used in the intake manifold assembly of FIGS. 5-7.
Figure 9:
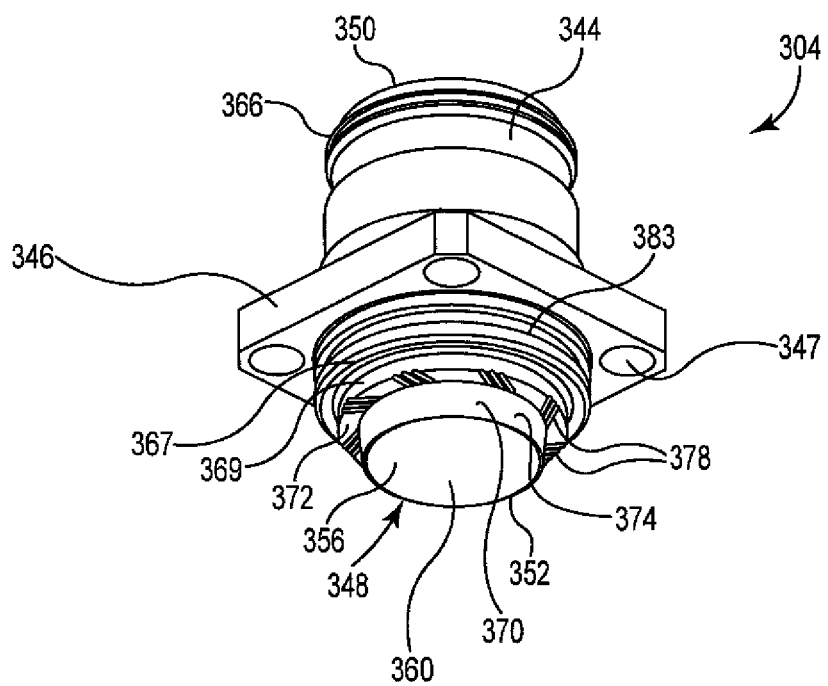
FIG. 9 is a bottom perspective view of the cover used in the intake manifold assembly of FIGS. 5-7.
Figure 10:
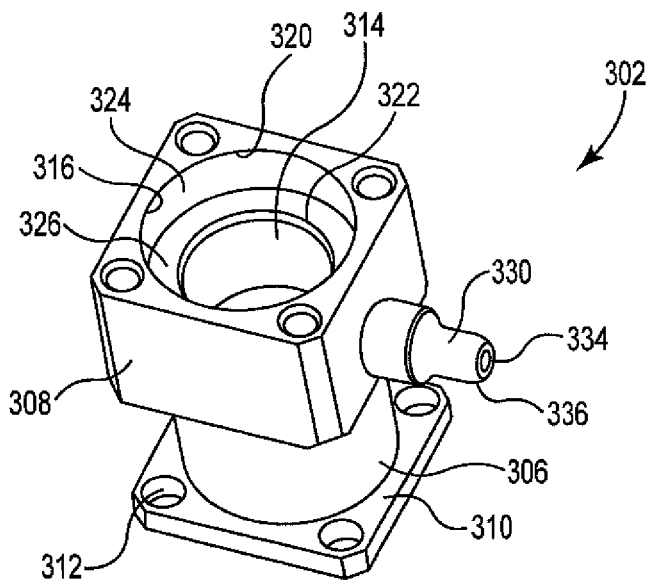
FIG. 10 is a top perspective view of the base used in the intake manifold assembly of FIGS. 5-7.
Figure 11:
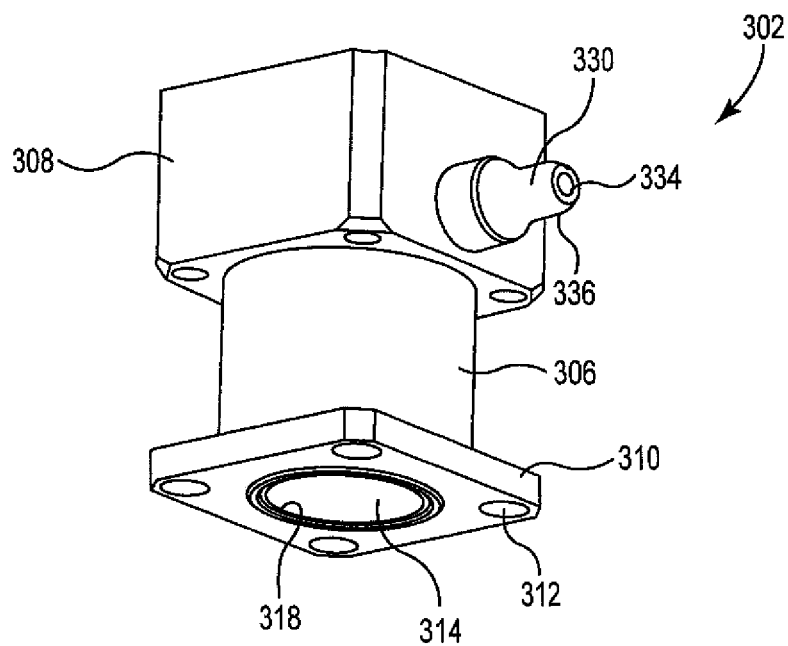
FIG. 11 is a bottom perspective view of the base used in the intake manifold assembly of FIGS. 5-7.

Stepped boss 348 includes body 367, neck 369, and collar 370. Referring to FIG. 7, o-ring 380 fits into a circumferential groove 383 on body 367 to help form a fluid tight seal between body 367 and sidewall 324 when cover 304 is mounted to base 302.

Cover 304 also includes at least a portion of the features used to generate the swirling flow of rinsing liquid. These features include guide wall 374 on collar 370, which helps to create an annular gap 384 in which a swirling flow is generated. Additionally, a slot 376 (see FIGS. 7 and 13) is provided on neck 369 and is aligned with the outlet 338. Slot 376 forms a flow channel to allow liquid exiting outlet 338 to enter reservoir 382.

A plurality of grooves 378 are formed in face 372 to serve as flow channels. The grooves 378 can be arranged in face 372 in a variety of ways. Generally, it is desirable to arrange the grooves 378 uniformly to help generate a more uniform sheeting action of generated swirling flows. In preferred embodiments as seen best in FIG. 13, the grooves are arranged in groups 391 with intervening lands 393. Doing this allows placement of slot 376 in a land 393 without interfering with the uniform distribution of grooves 378 on face 372.

Figure 13:
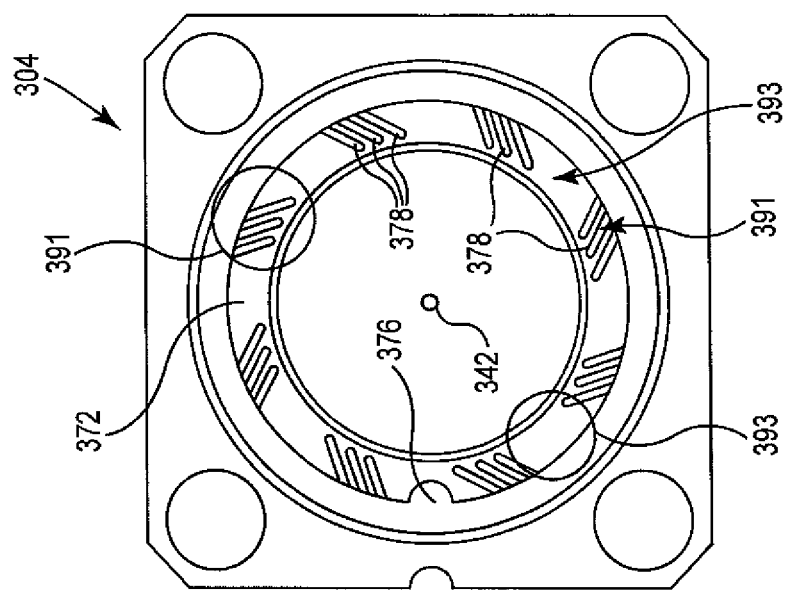
FIG. 13 is top view of the cover shown if FIG. 8.

The term obliquely in this context is contrasted to grooves that would be aimed generally radially inward toward central axis 342 (FIG. 13). Oblique grooves 378 are generally collectively aimed non-radially in a manner to generate a swirling flow in either a clockwise or a counterclockwise fashion with respect to a top view of passageway 356. Although each individual groove 378 need not be aimed obliquely to the same degree or even in the same oblique direction as other grooves 378, it is desirable that all grooves 378, if more than one groove is used, be aimed in substantially the same oblique direction to create either a clockwise swirling flow or a counterclockwise swirling flow.

Figure 4:
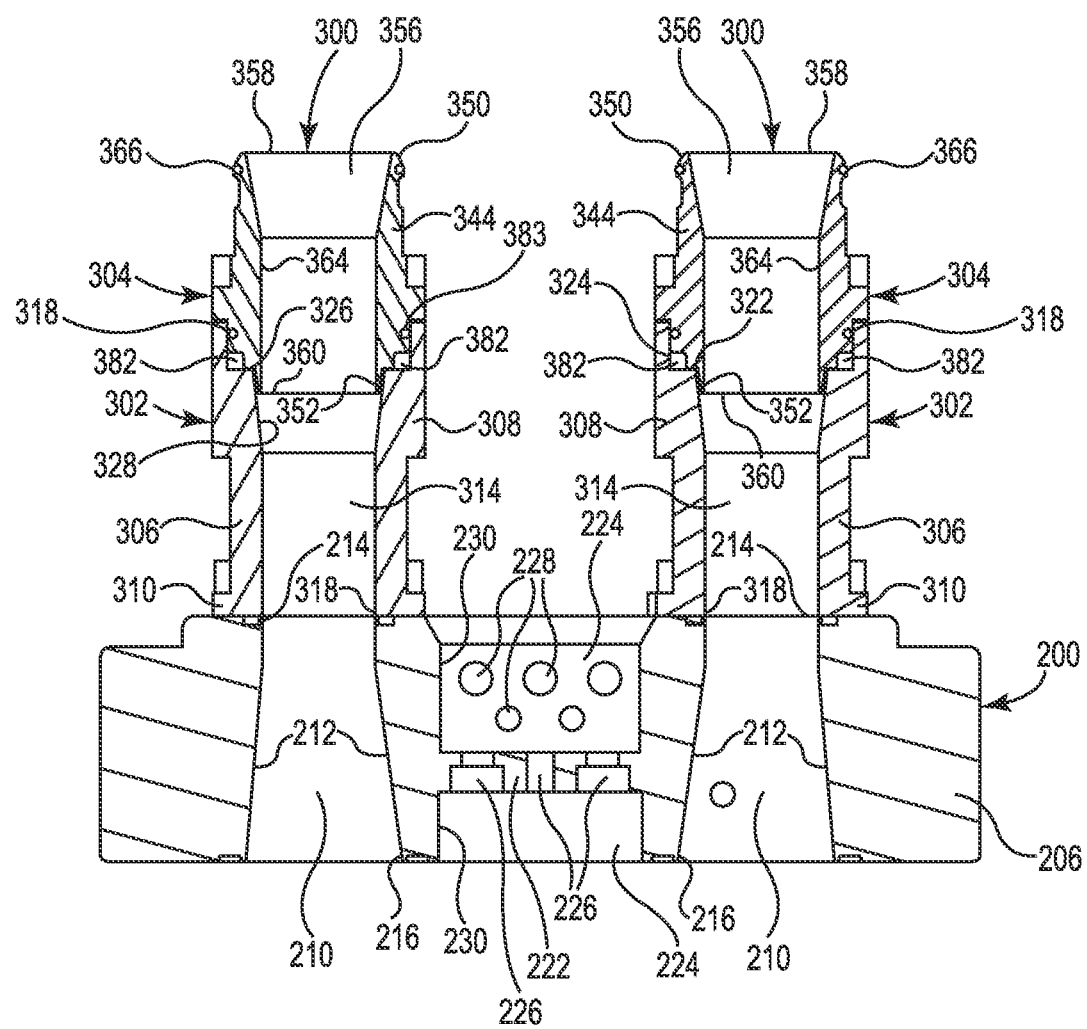
FIG. 4 is a side cross-section view showing the intake manifolds mounted to the collar as used in the tool of FIG. 1.
Figure 5:
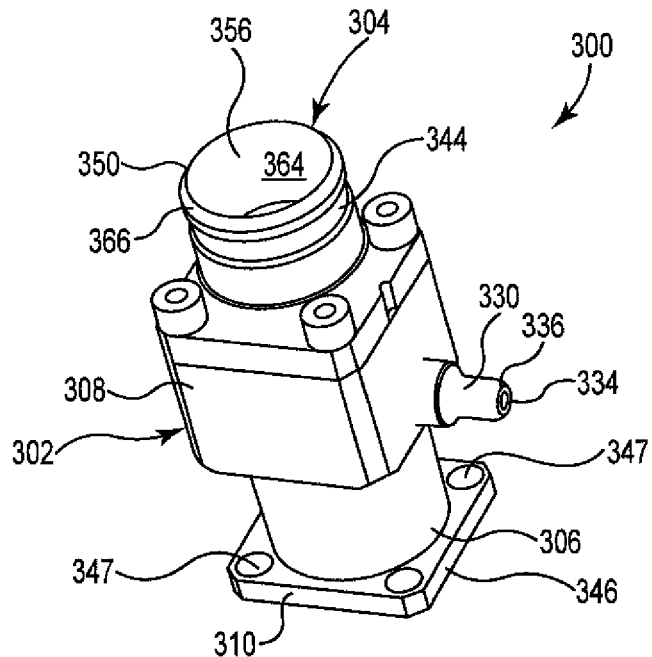
FIG. 5 is top perspective view of the intake manifold assembly used in the tool of FIG. 1.
Figure 6:
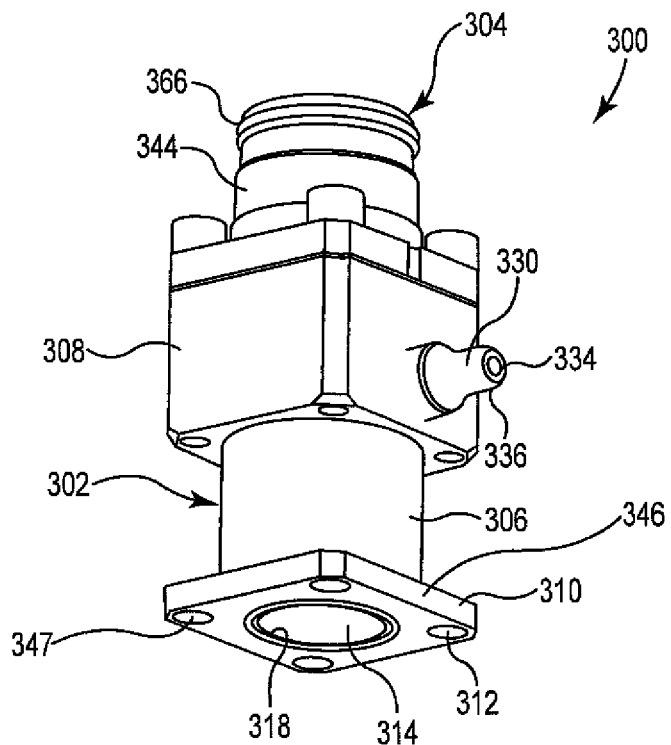
FIG. 6 is a bottom perspective view of the intake manifold assembly used in the tool of FIG. 1.

As seen best in FIG. 4 and FIG. 7, an annular reservoir 382 is formed in counterbore 320 when cover 304 is fitted into base 302. Generally annular gap 384 is formed between guide wall 374 of collar 370 and the wall 328. Guide wall 374 and wall 328 may be parallel in the area of gap 384 or may be nonparallel. In preferred embodiments, the gap 384 is slightly wider at the bottom. A diverging angle on the order of about 7 degrees would be suitable.

In use, rinsing liquid is supplied to rinsing supply conduit 332 by suitable plumbing supply lines (not shown). The rinsing liquid exits conduit 332 and fills annular reservoir 382 via outlet 338 and slot 376. From reservoir 382, the rinsing liquid is obliquely jetted inward toward guide wall 374 through flow channels formed by grooves 378. The rinsing liquid thus enters the annular gap 384. Due at least in part to the obliquely aimed grooves, a swirling flow of rinsing liquid is generated in gap 384. The width of the gap 384 can impact the quality of the swirling action. For instance, if the gap is too wide, the swirl action may be less than might be desired. In one embodiment, a gap of 0.004 inches would be suitable.

The flow generated in gap 384 continues to swirl toward process chamber 18 through passageway 314, sheeting across wall 328 without filling up passageways 314 and 356, then through collar passageway 210 sheeting across wall 212 without filling up passageway 210. The swirling rinsing liquid then flows outward from collar 200 onto the underside surface 58 of the barrier plate 56. Effective, very uniform wetting and rinsing of surface 58 is achieved. The swirling sheeting flow helps to keep rinsing liquid on the surfaces desired to be rinsed and helps to minimize or eliminate dripping.

Several advantages result from this approach. Wetting of the full surface passages 210, 314, and 356 via the swirling flow is desirably achieved as the swirling rinse liquid flows toward process chamber 18. Achieving full surface coverage at this stage helps to promote a smooth, sheeting flow of liquid onto and across the lower surface of the barrier plate 56. Gas flow accelerating through passages 210, 314, and 356 further promotes spreading and thinning of the liquid flow on the lower surface 58 of the barrier plate 56.

When dispensing water onto the preferably hydrophilic surfaces of the passages 210, 314, and 356, excellent sheeting action and coverage of the hydrophilic surfaces is observed with very little splashing or droplet formation. As the rinsing liquid flows onto the preferably hydrophilic lower surface 58 of the barrier plate 56, the sheets of flowing rinsing liquid smoothly and uniformly sheet over and cover the lower, hydrophilic surface of the barrier plate. As the rinsing liquid flows outward toward the outer periphery of the barrier plate, aspiration techniques desirably are used to collect at least some of the rinse liquid as described in Assignee's Co-Pending Application No. 3. Aspiration may occur while rinsing and/or at the end of rinsing.

Being positioned above the collar 200, the rinsing features incorporated into manifolds 300 also are well upstream from the process chamber 18. This helps to protect the rinsing structures from contamination. This also allows the rinse to reach all surfaces likely to bear residual chemicals. As an additional advantage, it is easier to develop and implement a swirling fluid flow that achieves excellent surface wetting. All in all, these numerous features and benefits associated with the rinsing features integrated into the manifolds 300 provide reduced particle contamination.

Barrier/dispense section 16 desirably includes one or more independent mechanisms for dispensing treatment materials into the processing chamber 18. For instance, the illustrative embodiment includes at least one, preferably at least two, and more preferably at least three different kinds of dispensing capabilities. As one capability, a dispensing structure is included that sprays one or more treatment fluids downward toward workpiece 12, generally across a radius of workpiece 12 so that full surface coverage is obtained via rotation of the workpiece 12 below the spray. In preferred embodiments, this capability is provided by a dispensing structure such as a spray bar mounted to barrier plate 56 and/or collar 200. A preferred embodiment of such a spray bar and methods of incorporating such a spray bar into a barrier/dispense section are described in Assignee's Co-Pending Application No. 3 as "spray bar 178".

As another dispensing capability, a dispensing structure may be included that dispenses treatment chemicals generally downward onto the center of the underlying workpiece 12. As workpiece 12 spins, the centrally dispensed materials are distributed over the workpiece surface. In preferred embodiments, this capability is provided by a central dispense nozzle assembly (not shown) mounted to floor 222 of collar 200. A preferred embodiment of such a nozzle is described as "center dispense nozzle assembly 518" in Assignee's Co-Pending Application No. 3. The mounting of this unit occurs similarly as is described in this co-pending application.

Additionally, gas distribution system 400 provides still yet another way to introduce processing materials, typically gases and/or vapors, optionally including entrained materials, into the processing chamber 18. The gas distribution system 400 supplies such flows to passageways 210, 314, and 356. From these, the one or more flows are dispensed downstream into the process chamber 18.

The dispensing components of the barrier/dispense section 16 may be coupled to one or more supplies (not shown) of treatment materials provided via suitable supply lines. These materials can be dispensed as supplied or blended on demand. A wide variety of treatment materials may be used, as tool 10 is quite flexible in the types of treatments that may be carried out. Just a small sampling of representative treatment materials include gases and liquids such as nitrogen, carbon dioxide, ammonia, clean dry air, steam, argon, HF gas, aqueous HF, aqueous isopropyl alcohol or other alcohols and/or tensioactive material(s), deionized water, aqueous or other solutions of ammonium hydroxide, aqueous or other solutions of sulfuric acid and/or its desiccating species and precursors (e.g. sulfur trioxide ($SO_3$), thiosulfuric acid ($H_2S_2O_3$), peroxosulfuric acid ($H_2SO_5$), peroxydisulfuric acid ($H_2S_2O_8$), fluorosulfuric acid ($HSO_3F$), and chlorosulfuric acid ($HSO_3Cl$)), aqueous or other solutions of nitric acid, aqueous or other solutions of phosphoric acid, aqueous or other solutions of hydrogen chloride, oxidizers such as hydrogen peroxide and/or ozone gas, aqueous ozone, surfactants, organic acids and solvents, chelating agents, oxygen scavengers, combinations of these and the like.

Gas supply system 400 is upstream from and is fluidly coupled to intake manifolds 300 to supply one or more gases, vapors, and/or the like to process chamber 18. For purposes of illustration, system 400 is fluidly coupled to manifolds 300 via two supply lines 444 and 448. In other embodiments, more or less supply lines may be used if desired.

System 400 incorporates amplified gas distribution station 462. Amplified gas distribution station 462 includes as main components air amplifier 498, valve 520, and manifold 464. On demand, the amplified gas distribution station 462 fluidly controllably couples the process chamber 18 to at least one source of ambient air. In preferred embodiments, amplified gas distribution station 462 is fluidly coupled to a source of ambient air in the robotics compartment associated with tool 10. This is advantageous because such air is often purified to an extremely high degree, even higher than a surrounding clean room ambient external to tool 10. This allows the amplified gas distribution station 462 to draw ambient air from a substantially particle free environment for very pure processing of microelectronic workpieces. Additionally, this conveniently places the station 462 in relative close proximity to the process chamber(s) served by the station.

Of course, the amplified gas distribution station 462 can be placed in other locations as desired so long as a suitable source of ambient air is practically accessible. Other representative candidate locations include other compartments of the tool 10, the surrounding clean room, other tools in the local clean room, or even distant tools or clean rooms. If the air intake of the air amplifier 498 is fitted with appropriate purification componentry, the air amplifier 498 can even be fluidly coupled to other sources of ambient air that would be purified by such componentry upstream from the air amplifier 498.

An air amplifier refers to a device that uses a relatively low flow of pressurized gas to generate a much larger flow of a relatively lower pressure gas. In many instances, the lower pressure gas is the ambient air. An air amplifier device takes energy from a small volume of pressurized gas to produce a high velocity, high-volume, low-pressure output airflow. Amplification ratios in the range of from greater than 1 to as much as 75:1 are achieved in many commercially available units. In the present invention amplification ratios in the range from greater than one to about 25:1 preferably from greater than about two to about 10:1 would be suitable. Under one set of conditions, using an amplification ratio of 4:1 was found to be suitable.

Air amplifier 498 includes an inlet 504 for receiving a pressurized gas flow via line 505 and an air intake 502 for receiving a feed of ambient air. Due to the internal structure of the air amplifier, the pressurized gas both pulls a much larger volume of ambient air into the air amplifier 498 through air intake 502 and also motivates the amplified ambient air to flow downstream toward manifold 464. Usually, the pressurized gas is sourced independently of the ambient air. Examples of other gases and vapors suitable for this application include nitrogen, argon, carbon dioxide, clean dry air, combinations of these, and the like. Even though the process chamber 18 is shown as being serviced by a single air amplifier 498, more than one air amplifier may serve one or more process chambers in other embodiments.

When valve 520 is open and the air amplifier 498 is operating, the flow of ambient air flows to manifold 464. From there, the air flows to intake manifolds 300 via lines 444 and 448. When the valve 520 is closed whether or not the flow of pressurized gas into the inlet 504 of air amplifier 498 is stopped (although it is desirable to stop the flow of the pressured gas into inlet 504 when valve 520 is closed), the environmentally controlled fluid pathways extending through manifold 464, supply lines 444 and 448, manifolds 300, and collar 200 are isolated from the ambient. Preferably, the valve 520 is normally closed so that, in the event of a power failure, the exposure of the downstream process chamber 18 to the ambient via is blocked.

A particularly preferred embodiment of an air amplifier is the model No. 40001 adjustable air amplifier commercially available from NEX except that the stainless steel locking nut provided with the commercially available unit is replaced with a locking nut manufactured from PVDF. The PVDF nut is substituted in order to cover and protect the stainless steel from chemical exposure. In other embodiments, additional components of the air amplifier, or even the entire air amplifier can be made from PVDF, PTFE, and/or other inert material(s).

Manifold 464 includes features that allow the manifold 464 to receive fluids from multiple sources and then distribute such fluids to one or more downstream destinations such as supply lines 444 and 448, manifolds 300, collar 200, and process chamber 18. Manifold 464 includes an inlet 468 for receiving a flow of amplified air and one or more independent inlets for receiving flows of non-ambient gases. For purposes of illustration, a single such independent inlet 472 is shown for supplying manifold with a supply of an inert gas such as nitrogen, carbon dioxide, or the like.

As an alternative to supplying a flow of amplified air, system 400 also may be used to supply other gases and vapors to process chamber 18. For example, a flow of one or more non-ambient gases, such as an inert gas such as nitrogen, surface tension modifying agent (e.g., isopropyl alcohol), an etching gas, oxidizing gas, ammonia, $CO_2$, clean dry air, and/or the like, can be introduced into the fluid pathways 444 and 448 via manifold 464 through supply line 472 by opening valve 66. If it is desired to further isolate chamber 18 from the ambient so as to exclude oxygen or for any other reason, the a curtain of gas may be provided to establish a barrier across gap 48.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. An apparatus for processing at least one microelectronic workpiece, the apparatus comprising:
    a) a process chamber in which the at least one microelectronic workpiece is positioned during processing;
    b) a barrier structure including a lower surface, wherein the lower surface overlies and at least partially covers the at least one microelectronic workpiece during processing;
    c) a passageway upstream from the process chamber, said passageway having a passageway wall fluidly coupled to the lower surface;
    d) an annular reservoir upstream from the passageway, said annular reservoir receiving a rinsing liquid from a rinsing liquid supply;
    e) an annular gap upstream from the passageway, said annular gap being fluidly coupled to the passageway wall; and
    f) a plurality of obliquely aimed nozzles through which the rinsing liquid is obliquely jetted from the annular reservoir into the annular gap, said annular gap having a width such that a swirling, sheeting flow of the rinsing liquid is generated in the annular gap and then continues to swirl and sheet across the passageway wall without filling up the passageway when the rinsing liquid is ejected through the nozzles and into the annular gap and such that the passageway wall guides the swirling, sheeting flow of the rinsing liquid in a manner effective to cause the swirling, sheeting flow to form a sheeting flow of the rinsing liquid on the lower surface of the barrier structure.

2. The apparatus of claim 1, wherein the barrier structure comprises an annular shape and wherein the lower surface of the barrier structure is angled downward in a radially outward direction from a central axis relative to the underlying workpiece.

3. The apparatus of claim 2, wherein the nozzles comprise a plurality of grooves to obliquely aim the rinsing liquid through the nozzles.

4. The apparatus of claim 1, wherein the nozzles comprise a plurality of nozzle groups, each group being obliquely aimed at the annular gap.

5. An apparatus for processing at least one microelectronic workpiece, the apparatus comprising:
    a) a process chamber in which the at least one microelectronic workpiece is positioned during processing
    b) a barrier structure including a lower surface that overlies and at least partially covers the at least one workpiece during processing;
    c) at least one pathway providing an egress into the process chamber, the pathway including a pathway surface that is fluidly coupled to the lower surface of the barrier structure;
    d) a generally annular gap positioned upstream from and fluidly coupled to the pathway surface; and
    e) a plurality of flow channels collectively obliquely directed toward the generally annular gap, said annular gap having a width such that a swirling, sheeting flow of a rinsing liquid flows from the annular gap onto the pathway surface when the rinsing liquid is obliquely ejected from the flow channels and through the annular gap and such that the swirling, sheeting flow of the rinsing liquid is conveyed as a sheeting flow to the lower surface of the barrier structure via one or more surfaces comprising at least the pathway surface of the pathway.

6. The apparatus of claim 5, wherein the pathway surface is fluidly coupled to the lower surface of the structure by one or more additional surfaces.

7. The apparatus of claim 6, wherein the pathway surface is directly coupled to the lower surface.

8. The apparatus of claim 6, wherein the pathway surface is indirectly coupled to the lower surface.

9. The apparatus of claim 5, wherein the barrier structure comprises an annular shape and wherein the lower surface of the barrier structure is angled downward in a radially outward direction from a central axis relative to the underlying workpiece.

* * * * *